(12) United States Patent
Kato

(10) Patent No.: US 7,332,399 B2
(45) Date of Patent: Feb. 19, 2008

(54) METHOD FOR MANUFACTURING A SEMICONDUCTOR SUBSTRATE AND METHOD FOR MANUFACTURING A SEMICONDUCTOR IN WHICH FILM THICKNESSES CAN BE ACCURATELY CONTROLLED

(75) Inventor: Juri Kato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 336 days.

(21) Appl. No.: 11/127,496

(22) Filed: May 11, 2005

(65) Prior Publication Data
US 2005/0255678 A1    Nov. 17, 2005

(30) Foreign Application Priority Data
May 11, 2004  (JP) ............................ 2004-141117
Oct. 22, 2004  (JP) ............................ 2004-307741

(51) Int. Cl.
*H01L 21/762*    (2006.01)
(52) U.S. Cl. ...................... 438/295; 438/424; 438/702; 438/739; 257/E21.103
(58) Field of Classification Search ................ 438/295, 438/429, 739; 257/E21.103
See application file for complete search history.

(56) References Cited

U.S. PATENT DOCUMENTS 5,232,866 A    8/1993  Beyer et al.
6,713,356 B1 *  3/2004  Skotnicki et al. ........... 438/285
6,727,186 B1 *  4/2004  Skotnicki et al. ........... 438/734
7,132,349 B2 * 11/2006  Kim et al. .................. 438/425
2006/0151833 A1 *  7/2006  Yang .......................... 257/347

FOREIGN PATENT DOCUMENTS

| JP | 5-206258 | 8/1993 |
| JP | 10-261799 | 9/1998 |
| KR | 95-003900 | 4/1995 |

OTHER PUBLICATIONS

Examination Result dated Aug. 17, 2006.

* cited by examiner

*Primary Examiner*—Stephen W. Smoot
(74) *Attorney, Agent, or Firm*—John J. Penny, Jr.; Edwards Angell Palmer & Dodge LLP

(57) ABSTRACT

A method of manufacturing semiconductor substrates. After supporting layers are provided on side walls of grooves formed in a semiconductor substrate, grooves that expose a second semiconductor layer are formed. Etching gas or etching liquid is brought in contact with the first semiconductor layer through the grooves, to form a void portion between the semiconductor substrate 1 and the second semiconductor layer. By thermally oxidizing the semiconductor substrate, the second semiconductor layer and the supporting layers, an oxide film is formed in the void portion between the semiconductor substrate and the second semiconductor layer, an oxide film is formed on side walls of the semiconductor substrate in the grooves, and the supporting layers are changed into oxide films.

19 Claims, 11 Drawing Sheets

METHOD FOR MANUFACTURING A SEMICONDUCTOR SUBSTRATE AND METHOD FOR MANUFACTURING A SEMICONDUCTOR IN WHICH FILM THICKNESSES CAN BE ACCURATELY CONTROLLED

BACKGROUND

1. Technical Field

The present invention relates to methods for manufacturing semiconductor substrates and methods for manufacturing semiconductor devices, and in particular, is preferably applied to field effect transistors formed on a SOI (Silicon On Insulator) substrate.

2. Description of Related Art

The utility of field effect transistors formed on a SOI substrate is attracting attention because they are easy for element isolation and latch-up free, and have small source/drain junction capacitances. In particular, because fully depleted type SOI transistors can be operated with low power consumption and at high speeds, researches on operating SOI transistors in a completely depleted mode are actively conducted. It is noted here that, as a SOI substrate, for example, a SIMOX (Separation by Implanted Oxygen) substrate, a laminated substrate or the like may be used.

Further, for example, Japanese Laid-open Patent Application HEI 10-261799 (JP '799) describes a method for forming a silicon thin film excellent in crystallinity and uniformity on a dielectric film of a large area, in which an amorphous or polycrystal silicon layer formed on a dielectric film is irradiated with a pulse-like ultraviolet beam, thereby forming a polycrystal silicon film composed of single-crystal grains each in a generally square shape arranged in a chessboard pattern on the dielectric film, and the surface of the polycrystal silicon film is planarized by CMP (chemical mechanical polishing).

However, to manufacture a SIMOX substrate, highly concentrated oxygen needs to be ion-injected in a silicon wafer. Also, to manufacture a laminated substrate, two silicon wafers need to be bonded together, and then the surface of the silicon wafer needs to be polished. For this reason, there is a problem that SOI transistors result in a cost increase, compared to field effect transistors that are formed in bulk semiconductor.

Furthermore, there is a problem in that the ion-injection and polishing cause a SOI layer to have large differences in its film thickness such that it is difficult to stabilize the characteristics of field effect transistors when the SOI layer is made into a thin film for manufacturing fully depleted type SOI transistors.

Also, the method described in JP '799 has a problem in that grain boundaries are generated in the single-crystal layer formed on the dielectric film because single-crystal grains are arranged in a chessboard pattern on the dielectric film, and the controllability of the film thickness of the single-crystal layer is poor because the single-crystal layer is planarized by polishing.

SUMMARY

Accordingly, it is an object of at least one embodiment of the present invention to provide methods for manufacturing semiconductor substrates and methods for manufacturing semiconductor devices with which their film thickness can be accurately controlled, and semiconductor layers can be formed on dielectrics at low costs.

To solve the problems described above, a method for manufacturing a semiconductor substrate in accordance with an embodiment of the present invention comprises: forming a first semiconductor layer on a semiconductor substrate; forming a second semiconductor layer having a etching rate smaller than a etching rate of the first semiconductor layer upon etching on the first semiconductor layer; forming a first groove that penetrates the first semiconductor layer and the second semiconductor layer, and exposes the semiconductor substrate; forming in the first groove a semiconductor supporting layer that is formed in a film on side walls of the first semiconductor layer and the second semiconductor layer and has a etching rate smaller than a etching rate of the first semiconductor layer upon etching; forming a second groove that exposes at least a part of the first semiconductor layer having the semiconductor supporting layer formed on the side wall through the second semiconductor layer; removing the first semiconductor layer by selectively etching the first semiconductor layer through the second groove; and forming a first dielectric film disposed on a back surface side of the second semiconductor layer and forming a second dielectric film on side walls of the first groove and the second groove, by thermally oxidizing the semiconductor substrate, the second semiconductor layer and the semiconductor supporting layer through the first groove and the second groove.

Consequently, the second semiconductor layer can be supported on the semiconductor substrate through the semiconductor supporting layer formed in the first groove, and the first semiconductor layer under the second semiconductor layer can be brought in contact with etching gas or etching liquid through the second groove. For this reason, while the second semiconductor layer can be stably supported on the semiconductor substrate, the first semiconductor layer between the second semiconductor layer and the semiconductor substrate can be removed, insulation between the second semiconductor layer and the semiconductor substrate can be achieved without damaging the quality of the second semiconductor layer, the first dielectric film can be formed on the back surface side of the second semiconductor layer by thermal oxidation of the second semiconductor layer, and the film thickness of the second semiconductor layer can be accurately controlled.

Also, a method for manufacturing a semiconductor substrate in accordance with an embodiment of the present invention is that the semiconductor substrate and the second semiconductor layer consist of single-crystal Si, the semiconductor supporting layer consists of single-crystal Si or an oxide dielectric film, and the first semiconductor layer consists of single-crystal SiGe.

Accordingly, lattice matching between the semiconductor substrate, the second semiconductor layer, the semiconductor supporting layer and the first semiconductor layer can be achieved, and the etching rate of the first semiconductor layer at the time of etching can be made greater compared to the semiconductor substrate, the second semiconductor layer and the semiconductor supporting layer. For this reason, the second semiconductor layer with excellent crystal quality can be formed on the first semiconductor layer, and the semiconductor supporting layer can be stably formed in the first groove, such that insulation between the second semiconductor layer and the semiconductor substrate can be achieved without damaging the quality of the second semiconductor layer.

Also, in a method for manufacturing a semiconductor substrate in accordance with an embodiment of the present invention, the first semiconductor layer is selectively etched by a fluorine nitrate treatment applied to the first semiconductor layer.

Accordingly, the etching rate of the first semiconductor layer at the time of etching can be made greater compared to the semiconductor substrate, the second semiconductor layer and the semiconductor supporting layer, the first semiconductor layer can be removed by wet etching, and insulation between the second semiconductor layer and the semiconductor substrate can be achieved without damaging the quality of the second semiconductor layer.

Also, a method for manufacturing a semiconductor substrate in accordance with an embodiment of the present invention further comprises embedding the first groove having the semiconductor supporting layer formed therein with a dielectric before the second groove is formed.

Accordingly, the semiconductor supporting layer can be reinforced with the dielectric, and therefore the second semiconductor layer can be stably supported on the semiconductor substrate even when the width of the first groove is narrow.

Also, a method for manufacturing a semiconductor substrate in accordance with an embodiment of the present invention further comprises embedding the first groove and the second groove with a dielectric after the first dielectric film is formed on the back surface side of the second semiconductor layer.

Accordingly, the first groove and the second groove can be embedded in a batch with the dielectric, such that an increase in the number of steps can be suppressed, and element isolation can be stably conducted.

Also, a method for manufacturing a semiconductor substrate in accordance with an embodiment of the present invention further comprises embedding at least a part of an area of the back surface side of the second semiconductor layer with a dielectric after the first dielectric film is formed on the back surface side of the second semiconductor layer.

Accordingly, film reduction of the second semiconductor layer and interface deterioration of the back surface of the second semiconductor layer can be prevented, and the back surface side of the second semiconductor layer can be embedded with a material other than an oxide film. For this reason, the film of dielectric embedded on the back surface side of the second semiconductor layer can be made thicker, its dielectric constant can be lowered, parasitic capacitance on the back surface side of the second semiconductor layer can be reduced, and the thermal conductivity can be increased.

Moreover, a method for manufacturing a semiconductor substrate in accordance with an embodiment of the present invention comprises: forming a first semiconductor layer on a semiconductor substrate; forming a second semiconductor layer having a etching rates smaller than a etching rate of the first semiconductor layer upon etching on the first semiconductor layer; forming an oxidation preventing film on the second semiconductor layer; forming a first groove that penetrates the first semiconductor layer, the second semiconductor layer and the oxidation preventing film, and exposes the semiconductor substrate; forming in the first groove a supporting layer that is formed in a film on side walls of the first semiconductor layer and the second semiconductor layer and has a etching rate smaller than a etching rate of the first semiconductor layer upon etching; forming a second groove that exposes at least a part of the first semiconductor layer having the supporting layer formed on the side wall through the second semiconductor layer; removing the first semiconductor layer by selectively etching the first semiconductor layer through the second groove; forming a dielectric film disposed on a back surface side of the second semiconductor layer by thermally oxidizing the semiconductor substrate and the second semiconductor layer through the second groove; and removing the oxidation preventing film on the second semiconductor layer with the dielectric film formed on the back surface side thereof.

Accordingly, the second semiconductor layer can be stably supported on the semiconductor substrate, the first semiconductor layer between the second semiconductor layer and the semiconductor substrate can be removed, and insulation between the second semiconductor layer and the semiconductor substrate can be achieved. Also, by providing the oxidation preventing film on the second semiconductor layer, the surface of the second semiconductor layer can be prevented from being thermally oxidized, and a thermal oxidation film can be formed on the back surface side of the second semiconductor layer. For this reason, after a thermal oxidation film is formed on the back surface side of the second semiconductor layer, a thermal oxidation film on the surface of the second semiconductor layer does not need to be removed, and the surface of the second semiconductor layer can be exposed, while preventing an element isolation dielectric film formed in the groove from being eroded.

Also, a method for manufacturing a semiconductor substrate in accordance with an embodiment of the present invention further comprises making the first semiconductor layer porous.

Accordingly, the etching rate of the first semiconductor layer can be increased, such that the etching rate of the first semiconductor layer with respect to the second semiconductor layer can be increased without changing the material of the first semiconductor layer and the second semiconductor layer. For this reason, while controlling the amount of etching of the second semiconductor layer, the first semiconductor layer under the second semiconductor layer can be removed, and the area of the SOI layer can be expanded. As a result, the gate width of SOI transistors can be widened, and the current drivability of SOI transistors can be improved.

Moreover, uniformity of the film thickness of the second semiconductor layer formed on the dielectric film can be improved, and uniformity of the dielectric film under the second semiconductor layer can be improved. For this reason, fully depleted type SOI transistors can be stably formed without using a SOI substrate, such that differences in the characteristics of fully depleted type SOI transistors can be reduced and their cost can be reduced.

Also, a method for manufacturing a semiconductor substrate in accordance with an embodiment of the present invention further comprises thermally oxidizing a part of the second semiconductor layer through the first groove.

Accordingly, the supporting layer that supports the second semiconductor layer can be formed by thermal oxidation of the first semiconductor layer, such that the thickness of the supporting layer can be made larger without expanding the width of grooves formed in the second semiconductor layer. For this reason, even when the first semiconductor layer under the second semiconductor layer is removed, the second semiconductor layer can be stably supported, and the first semiconductor layer under the second semiconductor layer can be removed in a wider area, such that the area of the SOI layer can be expanded. Also, element isolation regions can be reduced.

Also, a method for manufacturing a semiconductor substrate in accordance with an embodiment of the present invention comprises: forming a porous semiconductor layer on a semiconductor substrate; forming a non-porous semiconductor layer on the porous semiconductor layer; forming a first groove that penetrates the porous semiconductor layer and the non-porous semiconductor layer, and exposes the semiconductor substrate; forming in the first groove a supporting layer that is formed in a film on side walls of the porous semiconductor layer and the non-porous semiconductor layer and has a etching rate smaller than a etching rate of the porous semiconductor layer upon etching; forming a second groove that exposes at least a part of the porous semiconductor layer having the supporting layer formed on the side wall through the non-porous semiconductor layer; removing the porous semiconductor layer by selectively etching the porous semiconductor layer through the second groove; and forming a dielectric film disposed on a back surface side of the non-porous semiconductor layer by thermally oxidizing the semiconductor substrate and the non-porous semiconductor layer through the second groove.

Accordingly, the etching rate of the porous semiconductor layer at the time of etching can be made greater compared to the non-porous semiconductor layer, such that the porous semiconductor layer under the non-porous semiconductor layer can be removed while leaving the non-porous semiconductor layer. For this reason, dielectrics can be disposed under the non-porous semiconductor layer without using a SOI substrate, and therefore the cost of SOI transistors can be reduced.

Also, a method for manufacturing a semiconductor substrate in accordance with an embodiment of the present invention comprises: forming a porous semiconductor layer on a semiconductor substrate; forming a non-porous semiconductor layer on the porous semiconductor layer; forming a first groove that penetrates the porous semiconductor layer and the non-porous semiconductor layer, and exposes the semiconductor substrate; forming a supporting layer on a side wall of the porous semiconductor layer and the non-porous semiconductor layer by thermally oxidizing the side wall of the porous semiconductor layer through the first groove; forming a second groove that exposes at least a part of the porous semiconductor layer having the supporting layer formed on the side wall through the non-porous semiconductor layer; removing the porous semiconductor layer by selectively etching the porous semiconductor layer through the second groove; and forming a dielectric film disposed on a back surface side of the non-porous semiconductor layer by thermally oxidizing the semiconductor substrate and the non-porous semiconductor layer through the second groove.

Accordingly, the etching rate of the porous semiconductor layer at the time of etching can be made greater compared to the non-porous semiconductor layer, and the support layer that supports the non-porous semiconductor layer can be formed by thermal oxidation of the porous semiconductor layer. For this reason, while the non-porous semiconductor layer can be stably supported, and the porous semiconductor layer under the non-porous semiconductor layer can be removed. As a result, dielectrics can be disposed under the non-porous semiconductor layer without using a SOI substrate, and therefore the cost of SOI transistors can be reduced.

Also, in a method for manufacturing a semiconductor substrate in accordance with an embodiment of the present invention, the semiconductor substrate, the porous semiconductor layer, and the non-porous semiconductor layer consist of single-crystal Si.

Accordingly, while lattice matching between the semiconductor substrate, the porous semiconductor layer, and the non-porous semiconductor layer can be achieved, and the porous semiconductor layer under the non-porous semiconductor layer can be removed. For this reason, the non-porous semiconductor layer with excellent crystal quality can be formed on dielectrics without using a SOI substrate, and the cost of SOI transistors can be reduced.

In a method for manufacturing a semiconductor substrate in accordance with an embodiment of the present invention, the semiconductor substrate consist of single-crystal Si, and the porous semiconductor layer consist of SiGe, and the non-porous semiconductor layer consist of single-crystal Si.

Accordingly, while lattice matching between the semiconductor substrate, the porous semiconductor layer, and the non-porous semiconductor layer can be achieved, the porous semiconductor layer under the non-porous semiconductor layer can be removed. For this reason, the non-porous semiconductor layer with excellent crystal quality can be formed on dielectrics without using a SOI substrate, and the cost of SOI transistors can be reduced.

Also, a method for manufacturing a semiconductor substrate in accordance with an embodiment of the present invention is the porous semiconductor layer has a laminated structure composed of porous semiconductor layers of different materials.

Accordingly, the porous semiconductor layers of different materials can be thermally oxidized at the same time, and diffusion of elements included in the lower porous semiconductor layer into the non-porous semiconductor layer can be blocked by an oxide film formed by the thermal oxidation of the upper porous semiconductor layer. For this reason, even when the non-porous semiconductor layer and the porous semiconductor layer consist of different materials, the supporting layer can be formed by thermally oxidizing the porous semiconductor layer while suppressing deterioration of the film quality of the non-porous semiconductor layer.

Also, in a method for manufacturing a semiconductor substrate in accordance with an embodiment of the present invention, the porous semiconductor layer includes single-crystal Si laminated on single-crystal SiGe.

Accordingly, the porous single-crystal SiGe and the porous single-crystal Si can be thermally oxidized at the same time, and diffusion of Ge included in the porous single-crystal SiGe into the non-porous semiconductor layer can be blocked by an oxide film formed by the thermal oxidation of the porous single-crystal Si. For this reason, even when the non-porous semiconductor layer and the porous semiconductor layer consist of different materials, the supporting layer can be formed by thermally oxidizing the porous semiconductor layer while suppressing deterioration of the film quality of the non-porous semiconductor layer.

Also, a method for manufacturing a semiconductor device in accordance with an embodiment of the present invention comprises: forming a first semiconductor layer on a semiconductor substrate; forming a second semiconductor layer having a etching rates smaller than a etching rate of the first semiconductor layer upon etching on the first semiconductor layer; forming a first groove that penetrates the first semiconductor layer and the second semiconductor layer, and exposes the semiconductor substrate; forming in the first groove a semiconductor supporting layer that is formed in a film on side walls of the first semiconductor layer and the second semiconductor layer and has a etching rates smaller than a etching rate of the first semiconductor layer upon etching; forming a second groove that exposes at least a part of the first semiconductor layer having the semiconductor supporting layer formed on the side wall through the second semiconductor layer; removing the first semiconductor layer by selectively etching the first semiconductor layer through the second groove; forming a first dielectric film disposed on a back surface side of the second semiconductor layer and forming a second dielectric film on side walls of the first groove and the second groove by thermally oxidizing the semiconductor substrate, the second semiconductor layer and the semiconductor supporting layer through the first groove and the second groove; forming a gate electrode through a gate dielectric film over the second semiconductor layer; and forming source/drain layers disposed on both sides of the gate electrode in the second semiconductor layer.

Accordingly, while the second semiconductor layer can be stably supported on the semiconductor substrate, the first semiconductor layer between the second semiconductor layer and the semiconductor substrate can be removed, and the first dielectric film can be formed on the back surface side of the second semiconductor layer by thermal oxidation of the second semiconductor layer. For this reason, insulation between the second semiconductor layer and the semiconductor substrate can be achieved by a thermal oxidation film formed between the second semiconductor layer and the semiconductor substrate, an increase in the cost can be suppressed, and the quality of SOI transistors can be improved.

Also, a method for manufacturing a semiconductor device in accordance with an embodiment of the present invention comprises: forming a first semiconductor layer on a semiconductor substrate; forming a second semiconductor layer having a etching rate smaller than a etching rate of the first semiconductor layer upon etching on the first semiconductor layer; forming an oxidation preventing film on the second semiconductor layer; forming a first groove that penetrates the first semiconductor layer, the second semiconductor layer and the oxidation preventing film, and exposes the semiconductor substrate; forming in the first groove a supporting layer that is formed in a film on side walls of the first semiconductor layer and the second semiconductor layer and has a etching rate smaller than a etching rate of the first semiconductor layer upon etching; forming a second groove that exposes at least a part of the first semiconductor layer having the supporting layer formed on the side wall through the second semiconductor layer; removing the first semiconductor layer by selectively etching the first semiconductor layer through the second groove; forming a dielectric film disposed on a back surface side of the second semiconductor layer by thermally oxidizing the semiconductor substrate and the second semiconductor layer through the second groove; removing the oxidation preventing film on the second semiconductor layer with the dielectric film formed on the back surface side thereof, forming a gate electrode through a gate dielectric film over the second semiconductor layer; and forming source/drain layers disposed on both sides of the gate electrode in the second semiconductor layer.

Accordingly, by conducting thermal oxidation of the second semiconductor layer, the first dielectric film can be formed on the back surface side of the second semiconductor layer, while the surface of the second semiconductor layer can be prevented from being oxidized. For this reason, by a thermal oxidation film formed between the second semiconductor layer and the semiconductor substrate, insulation between the second semiconductor layer and the semiconductor substrate can be achieved, and the thermal oxidation film on the surface of the second semiconductor layer does not need to be removed, such that SOI transistors with excellent quality can be stably formed.

Also, a method for manufacturing a semiconductor device in accordance with an embodiment of the present invention further comprises making the first semiconductor layer porous.

Accordingly, the etching rate of the second semiconductor layer can be increased, and the first semiconductor layer under the second semiconductor layer can be removed while controlling the amount of etching of the second semiconductor layer. For this reason, uniformity of the film thickness of the SOI layer can be improved, and the area of the SOI layer can be expanded, such that the cost of SOI transistors can be reduced, and the SOI transistors can be stably formed.

Also, a method for manufacturing a semiconductor device in accordance with an embodiment of the present invention comprises: forming a porous semiconductor layer on a semiconductor substrate; forming a non-porous semiconductor layer on the porous semiconductor layer; forming a first groove that penetrates the porous semiconductor layer and the non-porous semiconductor layer, and exposes the semiconductor substrate; forming in the first groove a supporting layer that is formed in a film on side walls of the porous semiconductor layer and the non-porous semiconductor layer and has a etching rate smaller than a etching rate of the porous semiconductor layer upon etching; forming a second groove that exposes at least a part of the porous semiconductor layer having the supporting layer formed on the side wall through the non-porous semiconductor layer; removing the porous semiconductor layer by selectively etching the porous semiconductor layer through the second groove; forming a dielectric film disposed on a back surface side of the non-porous semiconductor layer by thermally oxidizing the semiconductor substrate and the non-porous semiconductor layer through the second groove; forming a gate electrode through a gate dielectric film over the non-porous semiconductor layer; and forming source/drain layers disposed on both sides of the gate electrode in the non-porous semiconductor layer.

Accordingly, the porous semiconductor layer under the non-porous semiconductor layer can be removed while leaving the non-porous semiconductor layer. For this reason, dielectrics can be disposed under the non-porous semiconductor layer without using a SOI substrate, such that the cost of SOI transistors can be reduced.

Also, a method for manufacturing a semiconductor device in accordance with an embodiment of the present invention comprises: forming a porous semiconductor layer on a semiconductor substrate; forming a non-porous semiconductor layer on the porous semiconductor layer; forming a first groove that penetrates the porous semiconductor layer and the non-porous semiconductor layer, and exposes the semiconductor substrate; forming a supporting layer on a side wall of the porous semiconductor layer and the non-porous semiconductor layer by thermally oxidizing the side wall of the porous semiconductor layer through the first groove; forming a second groove that exposes at least a part of the porous semiconductor layer having the supporting layer formed on the side wall through the non-porous semiconductor layer; removing the porous semiconductor layer by selectively etching the porous semiconductor layer through the second groove; forming a dielectric film disposed on a back surface side of the non-porous semiconductor layer by thermally oxidizing the semiconductor substrate and the non-porous semiconductor layer through the second groove; forming a gate electrode through a gate dielectric film over the non-porous semiconductor layer; and forming source/drain layers disposed on both sides of the gate electrode in the non-porous semiconductor layer.

Accordingly, while the non-porous semiconductor layer can be stably supported, the porous semiconductor layer under the non-porous semiconductor layer can be removed. For this reason, dielectrics can be disposed under the non-porous semiconductor layer without using a SOI substrate, and the cost of SOI transistors can be reduced.

Also, in a method for manufacturing a semiconductor device in accordance with an embodiment of the present invention, the first groove and the second groove are disposed in element isolation regions.

Accordingly, element isolation along the transverse direction and the longitudinal direction of the second semiconductor layer can be conducted in a batch, and grooves for removing the first semiconductor layer under the second semiconductor layer do not need to be provided in element forming regions. For this reason, SOI transistors can be formed while suppressing an increase in the number of manufacturing steps, and an increase in the chip size can be suppressed, such that the cost of SOI transistors can be reduced.

DETAILED DESCRIPTION OF THE INVENTION

Figure 1:
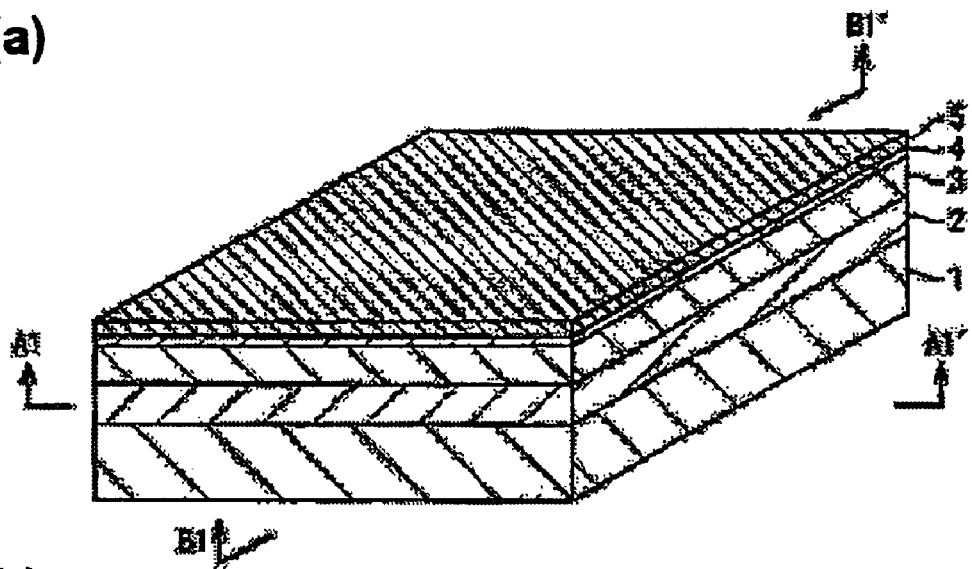
FIGS. 1(a)-1(c) are views showing a method for manufacturing a semiconductor device in accordance with a first embodiment of the present invention.
Figure 1:
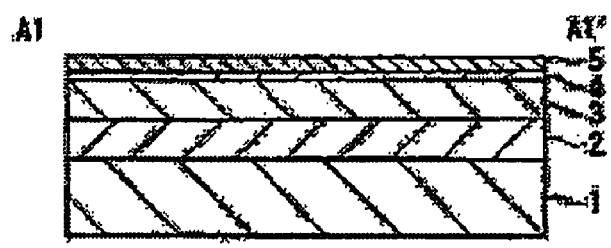
Figure 1:
Figure 2:
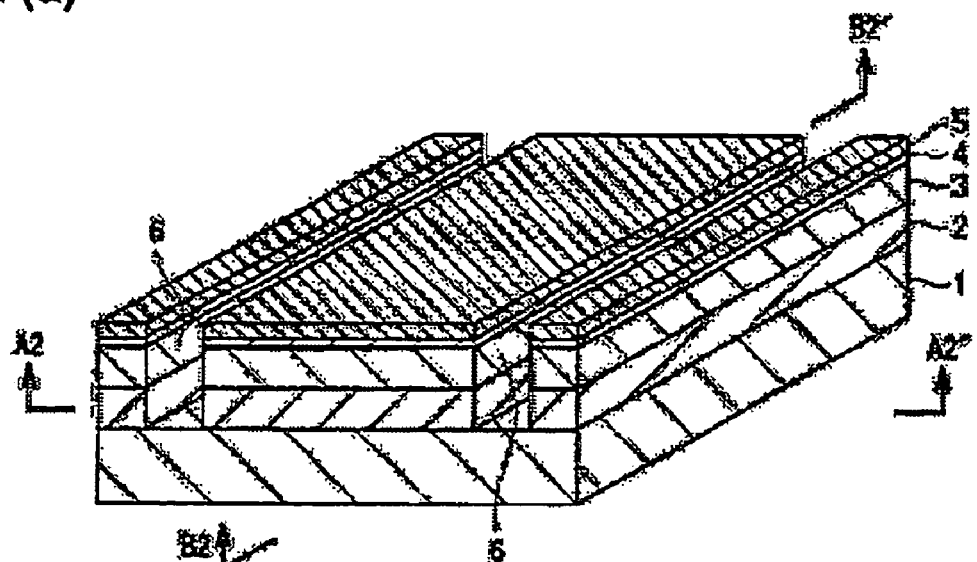
FIGS. 2(a)-2(c) are views showing the method for manufacturing a semiconductor device in accordance with the first embodiment of the present invention.
Figure 2:
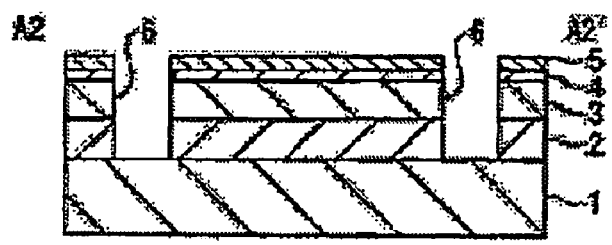
Figure 2:
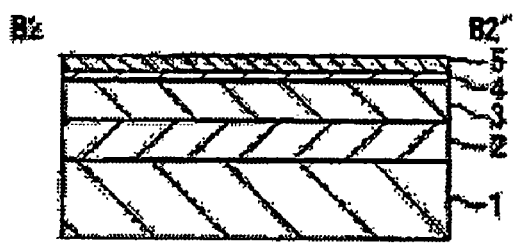
Figure 3:
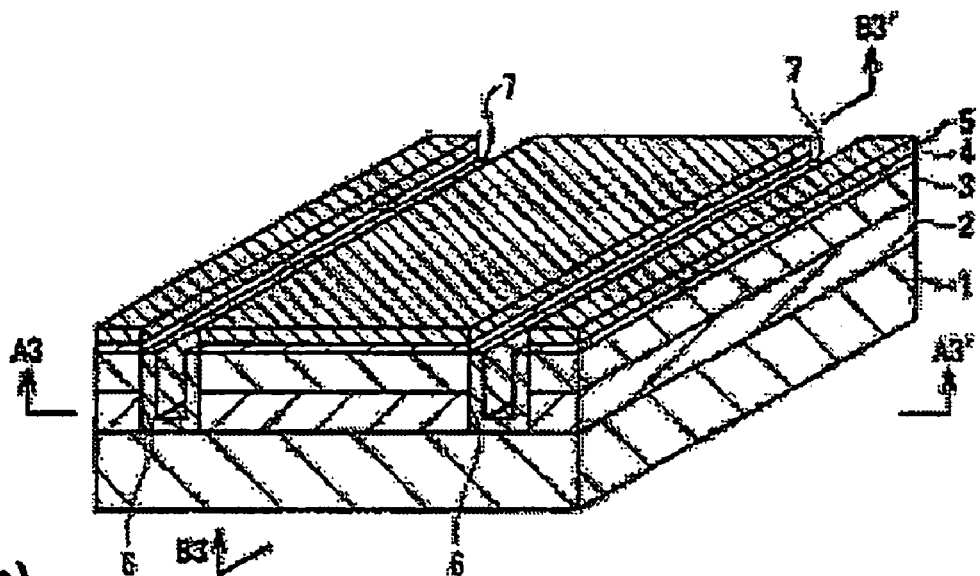
FIGS. 3(a)-3(c) are views showing the method for manufacturing a semiconductor device in accordance with the first embodiment of the present invention.
Figure 3:
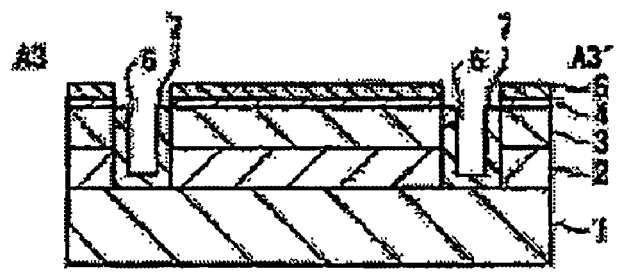
Figure 3:
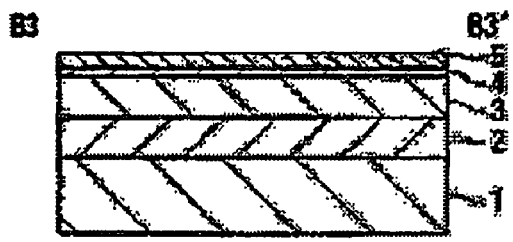
Figure 4:
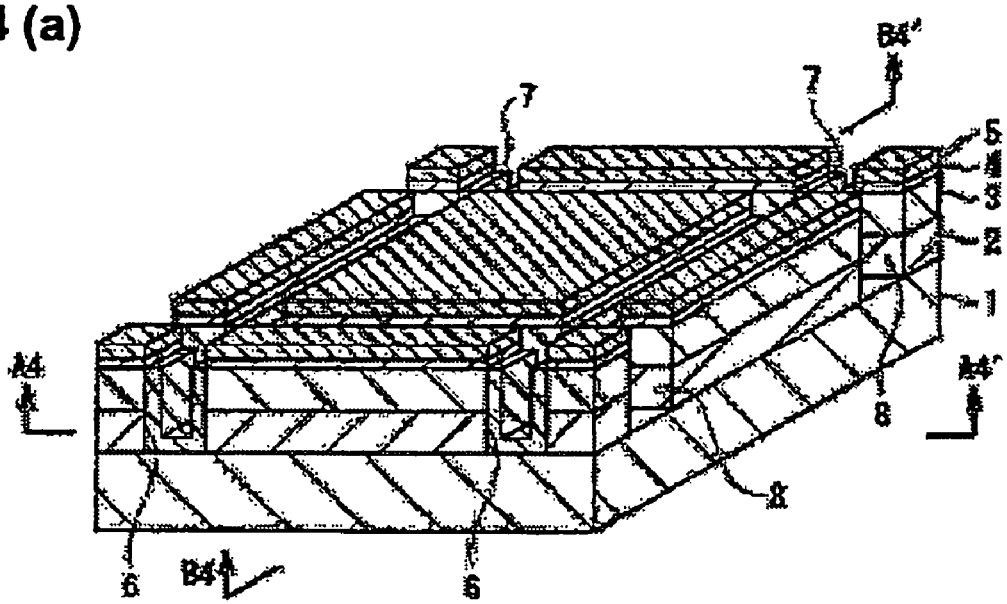
FIGS. 4(a)-4(c) are views showing the method for manufacturing a semiconductor device in accordance with the first embodiment of the present invention.
Figure 4:
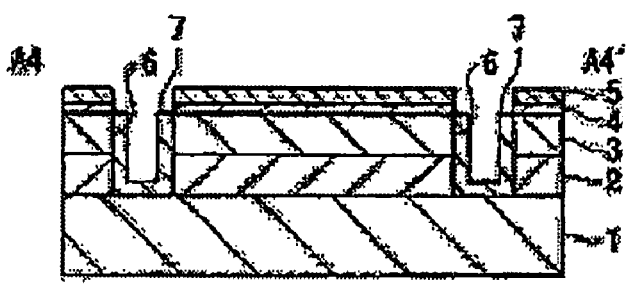
Figure 4:
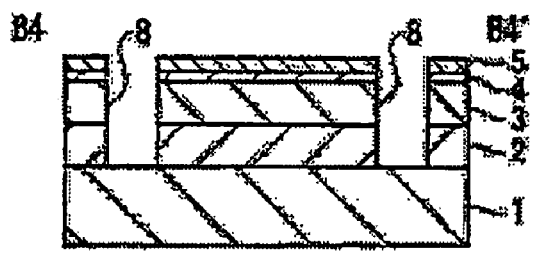
Figure 5:
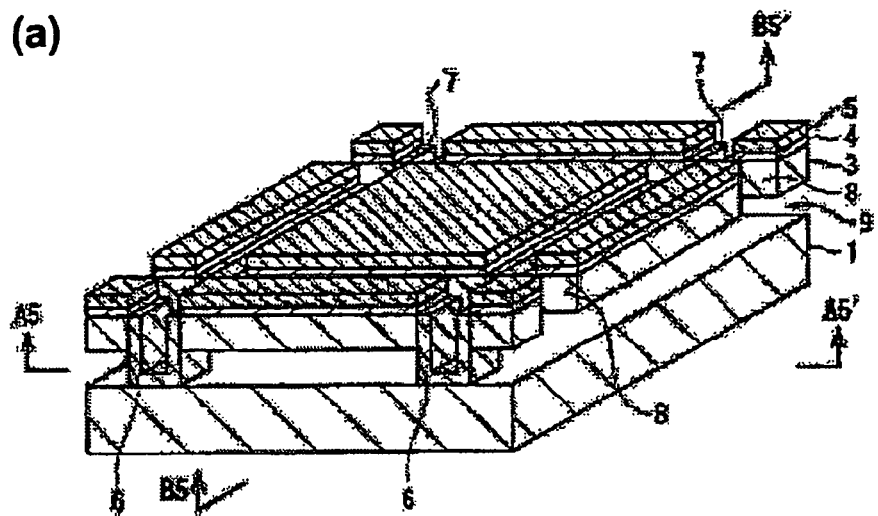
FIGS. 5(a)-5(c) are views showing the method for manufacturing a semiconductor device in accordance with the first embodiment of the present invention.
Figure 5:
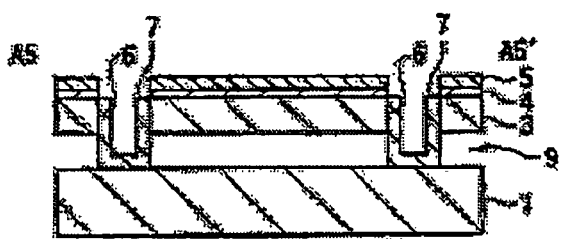
Figure 5:
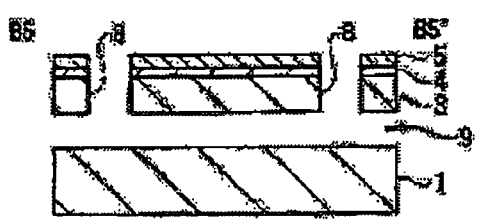
Figure 6:
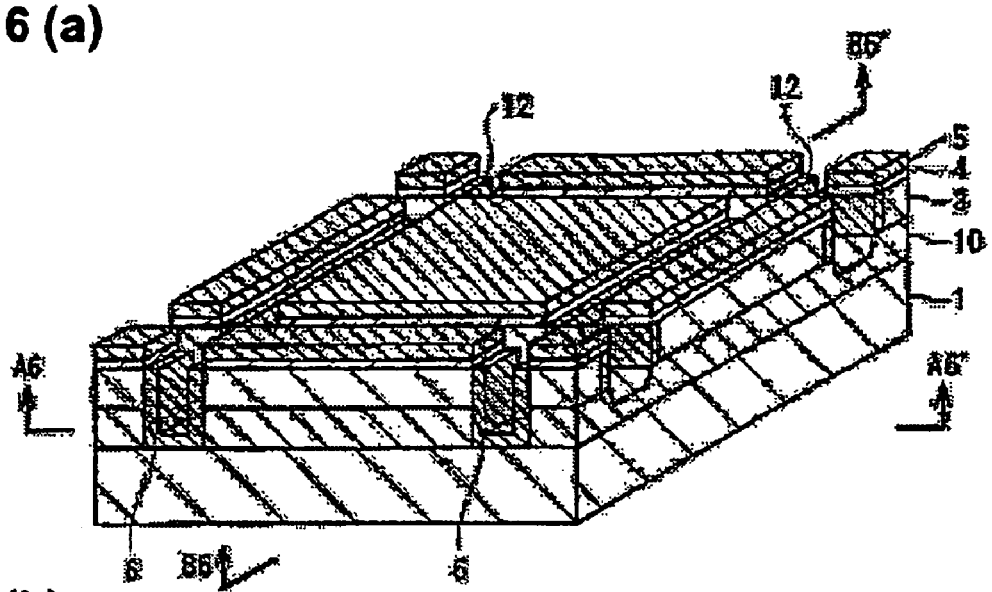
FIGS. 6(a)-6(c) are views showing the method for manufacturing a semiconductor device in accordance with the first embodiment of the present invention.
Figure 6:
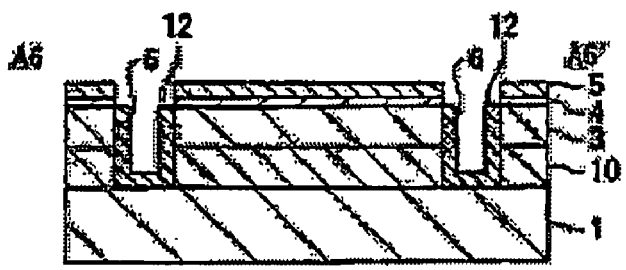
Figure 6:
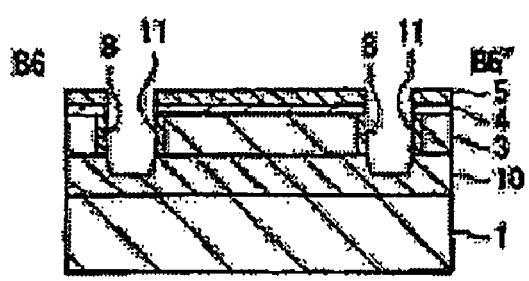
Figure 7:
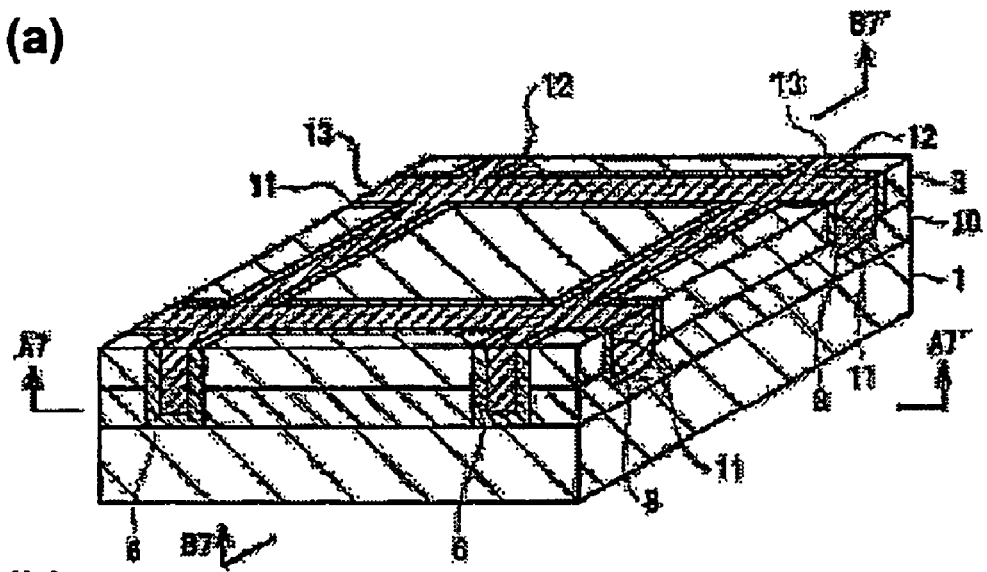
FIGS. 7(a)-7(c) are views showing the method for manufacturing a semiconductor device in accordance with the first embodiment of the present invention.
Figure 7:
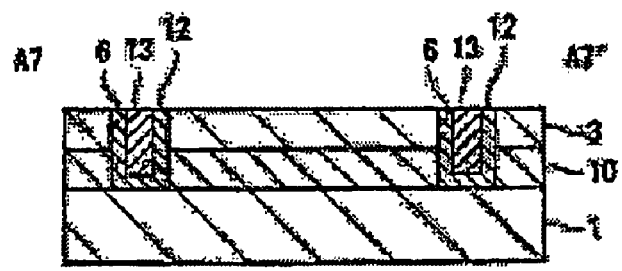
Figure 7:
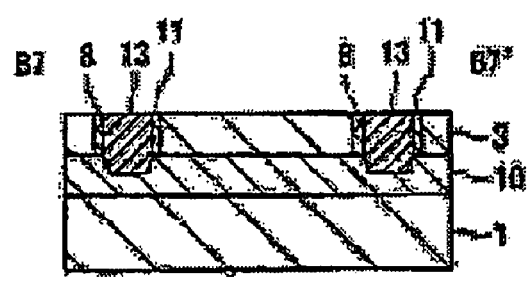

Methods for manufacturing semiconductor devices in accordance with embodiments of the present invention are described below with reference to the accompanying drawings.

FIGS. 1(a)-8(a) are perspective views illustrating a method for manufacturing a semiconductor device in accordance with a first embodiment of the present invention, FIGS. 1(b)-8(b) are cross-sectional views taken along lines A1-A1' to A8-A8' in FIGS. 1(a)-8(a), respectively, and FIGS. 1(c)-8(c) are cross-sectional views taken along lines B1-B1' to B8-B8' in FIGS. 1(a)-8(a), respectively.

Referring to FIGS. 1(a)-1(c), a first semiconductor layer 2 is formed on a semiconductor substrate 1, and a second semiconductor layer 3 is formed on the first semiconductor layer 2. It is noted that the first semiconductor layer 2 can use a material having a greater etching rate at the time of etching, compared to the semiconductor substrate 1 or the second semiconductor layer 3. As materials of the semiconductor substrate 1, the first semiconductor layer 2, and the second semiconductor layer 3, for example, a combination selected from among Si, Ge, SiGe, SiC, SiSn, PbS, GaAs, InP, GaP, GaN and ZnSe can be used. In particular, when the semiconductor substrate 1 consists of Si, SiGe may preferably be used as the first semiconductor layer 2, and Si as the second semiconductor layer 3. Accordingly while lattice matching between the first semiconductor layer 2 and the second semiconductor layer 3 can be achieved, the etching rate between the first semiconductor layer 2 and the second semiconductor layer 3 can be secured.

Then, by thermally oxidizing the second semiconductor layer 3, a sacrificial oxide film 4 is formed on the surface of the second semiconductor layer 3. Then, by using a CVD method or the like, an oxidation preventing film 5 is formed over the entire surface of the sacrificial oxide film 4. It is noted that a silicon nitride film, for example, can be used as the oxidation preventing film 5.

Next, as shown in FIGS. 2(a)-2(c), by using photolithography technique and etching technique, the oxidation preventing film 5, the sacrificial oxide film 4, the second semiconductor layer 3 and the first semiconductor layer 2 are patterned, thereby forming grooves 6 that expose part of the semiconductor substrate 1. It is noted that, when part of the semiconductor substrate 1 is exposed, the etching process may be stopped at the surface of the semiconductor substrate 1, or recessed portions may be formed in the semiconductor substrate 1 by over-etching the semiconductor substrate 1. Also, disposing positions of the grooves 6 can be made to correspond to portions of element isolation regions of the second semiconductor layer 3.

Next, as shown in FIGS. 3(a)-3(c) supporting layers 7 that support the first semiconductor layer 2 on the semiconductor substrate 1 are formed in films on side walls of the first semiconductor layer 2 and the second semiconductor layer 3 in the grooves 6. It is noted that, for forming the supporting layers 7 in films on side walls of the first semiconductor layer 2 and the second semiconductor layer 3, semiconductor epitaxial growth can be used. By using the semiconductor epitaxial growth, the supporting layers 7 can be selectively formed on the side walls of the first semiconductor layer 2 and the second semiconductor layer 3, and on the surface of the semiconductor substrate 1. It is noted that the material of the supporting layers 7 can be selected from among, for example, Si, Ge, SiGe, SiC, SiSn, PbS, GaAs, InP, GaP, GaN or ZnSe. In particular, when the semiconductor substrate 1 and the second semiconductor layer 3 consist of Si, and the first semiconductor layer 2 consists of SiGe, Si may preferably be used as the supporting layers 7.

Accordingly, lattice matching between the supporting layers 7 and the second semiconductor layer 3 can be achieved, and the etching rate between the supporting layers 7 and the first semiconductor layer 2 can be secured. Also, by using semiconductor such as Si as the material of the supporting layers 7, the three-dimensional structure with the semiconductor can be maintained even when the first semiconductor layer 2 is removed. For this reason, chemical resistance and mechanical stress resistance can be improved, and a stable element isolation process with excellent reproducibility can be achieved. It is noted that, besides semiconductor, dielectric material such as a silicon oxide film or the like can be used as a material of the supporting layers 7.

Next, as shown in FIGS. 4(a)-4(c), by using photolithography technique and etching technique, the oxidation preventing film 5, the sacrificial oxide film 4, the second semiconductor layer 3 and the first semiconductor layer 2 are patterned, thereby forming grooves 8 that expose part of the first semiconductor layer 3. It is noted here that disposing positions of the grooves 8 can be made to correspond to remaining portions of the element isolation regions of the second semiconductor layer 3.

It is noted that, when part of the first semiconductor layer 2 is exposed, the etching process may be stopped at the surface of the first semiconductor layer 2, or recessed portions may be formed in the first semiconductor layer 2 by over-etching the first semiconductor layer 2. Alternatively, the first semiconductor layer 2 in the grooves 8 may be penetrated to expose the surface of the semiconductor substrate 1. It is noted here that if etching of the first semiconductor layer 2 is stopped halfway through, the surface of the semiconductor substrate 1 in the grooves 8 can be prevented from being exposed. For this reason, when the first semiconductor layer 2 is removed by etching, the time during which the semiconductor substrate 1 in the grooves 8 is exposed to etching liquid or etching gas can be reduced, and over-etching of the semiconductor substrate 1 in the grooves 8 can be controlled.

Next, as shown in FIGS. 5(a)-5(c), etching gas or etching liquid is brought in contact with the first semiconductor layer 2 through the grooves 8, whereby the first semiconductor layer 2 is removed, and a void portion 9 is formed between the semiconductor substrate 1 and the second semiconductor layer 3.

It is noted here that, by forming the supporting layers 7 in the grooves 6, the second semiconductor layer 3 can be supported on the semiconductor substrate 1 even when the first semiconductor layer 2 is removed, and by providing the grooves 8 independently of the grooves 6, the etching gas or the etching liquid can be brought in contact with the first semiconductor layer 2 under the second semiconductor layer 3. For this reason, insulation between the second semiconductor layer 3 and the semiconductor substrate 1 can be achieved without damaging the quality of the second semiconductor layer 3.

It is noted that, when the semiconductor substrate 1, the second semiconductor layer 3 and the supporting layer 7 consist of Si, and the first semiconductor layer 2 consists of SiGe, fluorine nitrate may preferably be used as etching liquid for the first semiconductor layer 2. By this, the etching rate of Si and SiGe becomes to be about 1:100 to 10000 such that the first semiconductor layer 2 can be removed, while over etching of the semiconductor substrate 1, the second semiconductor layer 3 and the supporting layers 7 can be suppressed. Also, as the etching liquid for the first semiconductor layer 2, fluorine nitrate/hydrogen peroxide mixture, ammonia/hydrogen peroxide mixture, or fluorine acetate/hydrogen peroxide mixture may be used.

Next, as shown in FIGS. 6(a)-6(c), the semiconductor substrate 1, the second semiconductor layer 3 and the supporting layers 7 are thermally oxidized, thereby forming an oxide film 10 in the void portion 9 between the semiconductor substrate 1 and the second semiconductor layer 3, forming an oxide film 11 on side walls of the second semiconductor layer 3 in the grooves 8, and further changing the supporting layers 7 to oxide films 12.

By this, the film thickness of the second semiconductor layer 3 after element isolation can be defined by the film thickness of the second semiconductor layer 3 upon epitaxial growth and the film thickness of the oxide film 11 upon thermal oxidation of the second semiconductor layer 3. For this reason, differences in the film thickness of the second semiconductor layer 3 can be reduced, and the second semiconductor layer 3 can be made into a thinner film. It is noted that the oxide film 10 may be formed such that the void portion 9 is entirely embedded, or may be formed such that a part of the void portion may remain.

Also, by successively forming films of the first semiconductor layer 2 and the second semiconductor layer 3 having mutually different etching rates upon etching on the semiconductor substrate 1, and by forming the grooves 6 and 8 divided in two portions, the oxide film 10 can be formed in the void portion 9 between the semiconductor substrate 1 and the second semiconductor layer 3. For this reason, an increase in the number of manufacturing steps can be suppressed, the SOI substrate with excellent quality can be stably manufactured, an increase in the cost can be suppressed, and SOI transistors can be stably manufactured.

Also, by providing the oxidation preventing film 5 on the second semiconductor layer 3, the oxide film 10 can be formed on the back surface side of the second semiconductor layer 3, while preventing the surface of the second semiconductor layer 3 from being thermally oxidized. For this reason, the surface of the second semiconductor layer 3 can be exposed, while preventing the oxide films 12 and 11 formed in the grooves 6 and 8, respectively, from being eroded, and transistors can be formed in the second semiconductor layer 3 while element isolation can be stably performed.

Also, by matching the disposing positions of the grooves 6 and 8 to element isolation regions of the second semiconductor layer 3, element isolation along the transverse direction and the longitudinal direction of the second semiconductor layer 3 can be conducted in a batch, and grooves for removing the first semiconductor layer 2 under the second semiconductor layer 3 do not need to be provided separately. For this reason, SOI transistors can be formed while suppressing an increase in the number of manufacturing steps, and an increase in the chip size can be suppressed, such that the cost of SOI transistors can be reduced.

It is noted that, after the oxide films 10, 11 and 12 are formed, a high-temperature annealing is conducted. By this, the oxide films 10, 11 and 12 can be re-flowed, such that stresses in the oxide films 10, 11 and 12 can be alleviated, and the interface state can be reduced.

Next, as shown in FIGS. 7(a)-7(c), the grooves 6 and 8 are embedded with an embedding dielectric layer 13 by a CVD method or the like, and then the sacrificial oxide film 4 and the oxidation preventing film 5 are removed. By this, the grooves 6 and 8 can be embedded with the embedding dielectric layer 13 in a batch, such that element isolation can be stably conducted while suppressing an increase in the number of manufacturing steps. It is noted that the grooves 6 and 8 can be embedded with the embedding dielectric layer 13 after the sacrificial oxide film 4 and the oxidation preventing film 5 are removed. Moreover, if necessary, the embedding dielectric layer 13 may be planarized by a CMP (chemical mechanical polishing) method or the like.

Figure 8:
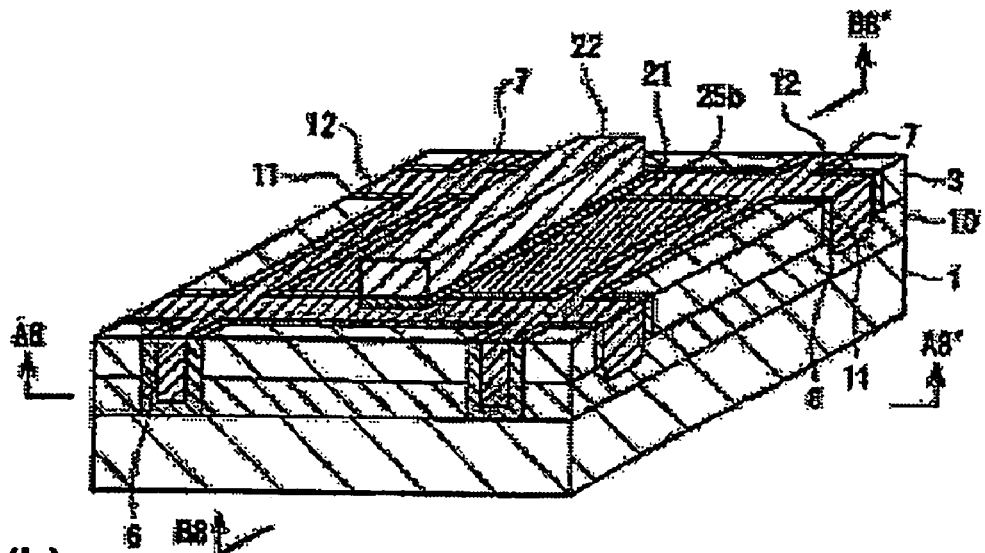
FIGS. 8(a)-8(c) are views showing the method for manufacturing a semiconductor device in accordance with the first embodiment of the present invention.
Figure 8:
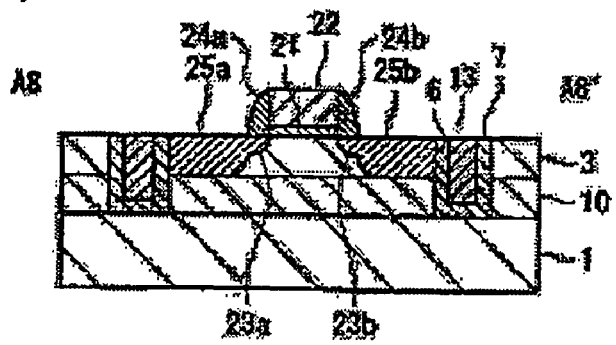
Figure 8:
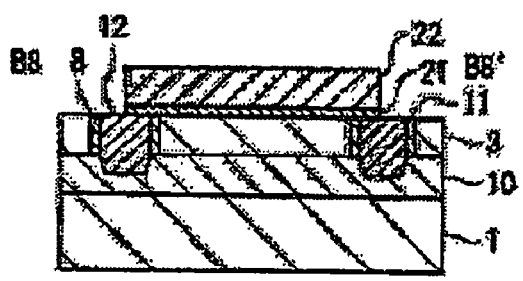

Next, as shown in FIGS. 8(*a*)-8(*c*), a gate dielectric film 21 is formed on the surface of the second semiconductor layer 3 by thermally oxidizing the surface of the second semiconductor layer 3. Then, by using a CVD method or the like, a polycrystal silicon layer is formed over the second semiconductor layer 3 having the gate dielectric film 21 formed thereon. Then, the polycrystal silicon layer is patterned by using photolithography technique and etching technique, to thereby form a gate electrode 22 on the second semiconductor layer 3.

Next, by using the gate electrode 22 as a mask, impurities such as, P, B or the like are ion-implanted in the second semiconductor layer 3, to form LDD layers 23*a* and 23*b* consisting of low concentration impurity introduced layers disposed on both sides of the gate electrode 22 in the second semiconductor layer 3. Then, a dielectric layer is formed by a CVD method or the like, on the second semiconductor layer 3 where the LDD layers 23*a* and 23*b* are formed, and then the dielectric layer is etched back by using anisotropic etching such as RIE, whereby side walls 24*a* and 24*b* are formed on side walls of the gate electrode 22, respectively. Then, using the gate electrode 22 and the side walls 24*a* and 24*b* as a mask, impurities such as, P, B or the like are ion-implanted in the second semiconductor layer 3, to form source/drain layers 25*a* and 25*b* consisting of high concentration impurity introduced layers disposed on both sides of the side walls 24*a* and 24*b*, respectively, in the second semiconductor layer 3.

It is noted that, in the above-described embodiment, the description is made as to a method in which, after the oxide films 10, 11 and 12 are formed, the grooves 6 and 8 are embedded with the embedding dielectric layer 13 in a batch. However, before the grooves 8 are formed, the grooves 6 with the supporting layers 7 formed therein may be embedded with a dielectric. By this, the supporting layers 7 can be reinforced by the dielectric, such that the second semiconductor layer 3 can be supported on the semiconductor substrate 1 even when the width of the grooves 6 is narrow.

Also, in the above-described embodiment, the description is made as to a method in which the second semiconductor layer 3 is laminated in only one layer over the semiconductor substrate 1 through the oxide film 10. However, plural semiconductor layers may be laminated over the semiconductor substrate 1 through oxide films, respectively.

Also, in the above-described embodiment, the description is made as to a method in which the oxidation preventing film 5 is formed on the second semiconductor layer 3 to prevent thermal oxidation of the surface of the second semiconductor layer 3 when the oxide films 10, 11 and 12 are formed. However, the oxide films 10, 11 and 12 may be formed without forming the oxidation preventing film 5 on the second semiconductor layer 3. In this case, an oxide film that is formed on the surface of the second semiconductor layer 3 when the oxide films 10, 11 and 12 are formed may be removed by etching or polishing.

Also, in the above-described embodiment, the description is made as to a method in which the oxide film 10 is formed in the void portion 9 between the semiconductor substrate 1 and the second semiconductor layer 3 by thermally oxidizing the semiconductor substrate 1 and the second semiconductor layer 3. However, the void portion 9 between the semiconductor substrate 1 and the second semiconductor layer 3 may be embedded with a dielectric film by a chemical vapor deposition method. In this case, the dielectric film may be formed to embed the entire void portion 9, or to embed in a manner that a part of the void portion remains. By this, while film reduction of the second semiconductor layer 3 can be prevented, the back surface side of the second semiconductor layer 3 can be embedded with a material other than an oxide film. For this reason, the film of dielectric embedded on the back surface side of the second semiconductor layer 3 can be made thicker, its dielectric constant can be lowered, and parasitic capacitance on the back surface side of the second semiconductor layer 3 can be reduced.

Figure 9:
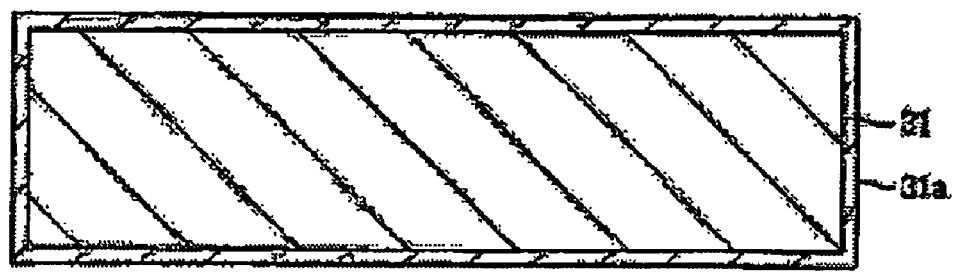
FIGS. 9(a)-9(c) are views showing a method for manufacturing a semiconductor device in accordance with a second embodiment of the present invention.
Figure 9:
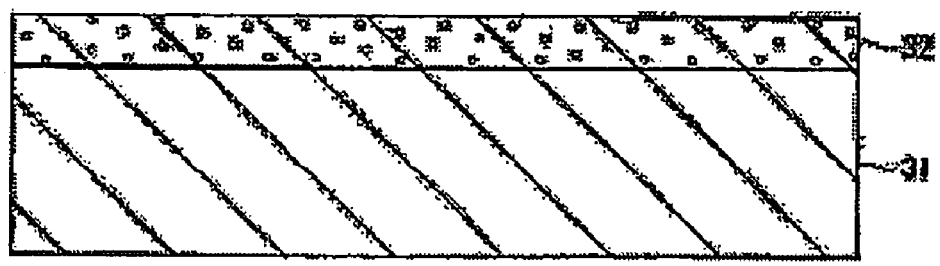
Figure 9:

FIGS. 9(*a*)-9(*c*) are cross-sectional views showing a method for manufacturing a semiconductor device in accordance with a second embodiment of the present invention. Referring to FIG. 9(*a*), by diffusing a p-type impurity in a semiconductor substrate 31, a p-type impurity diffusion layer 31*a* is formed on the surface of the semiconductor substrate 31. It is noted that ion injection may be conducted or epitaxial growth of p-type semiconductor may be conducted for forming the p-type impurity diffusion layer 31*a* on the surface of the semiconductor substrate 31.

Next, as shown in FIG. 9(*b*), by conducting a chemical conversion treatment (anodic chemical conversion reaction) on the semiconductor substrate 31, the surface layer of the semiconductor substrate 31 is made porous, to thereby form a porous semiconductor layer 32 on the surface layer of the semiconductor substrate 31.

It is noted that a chemical conversion bath is used for the chemical conversion treatment. The chemical conversion bath includes upper and lower electrolytic chambers with a semiconductor wafer interposed therebetween, wherein HF for forming porous semiconductor is fed in the upper portion, and HF as a liquid electrode is fed in the lower portion. An upper portion of a platinum electrode disposed in HF is made to be a cathode, and a lower portion of a platinum electrode is made to be an anode, whereby the upper surface of the semiconductor wafer can be made porous.

It is noted that if p-type semiconductor is used as the semiconductor substrate 31, a Schottky barrier is generated between the substrate and the lower electrode. For this reason, it is preferred to form the p-type impurity diffusion layer 31*a* on the surface of the semiconductor substrate 31. Further, by lowering the concentration of HF, and also lowering the current density for chemical conversion, the film thickness of the porous semiconductor layer 32 can be controlled by the chemical conversion time.

Next, as shown in FIG. 9(*c*), a non-porous semiconductor layer 33 is formed on the porous semiconductor layer 32 by epitaxial growth. It is noted that, as materials for the semiconductor substrate 31, the porous semiconductor layer 32 and the non-porous semiconductor layer 33, for example, Si, Ge, SiGe, SiC, SiSn, PbS, GaAs, InP, GaP, GaN, ZnSe or the like can be used. Then, processings similar to the processings shown in FIGS. 1 through 8 are conducted.

By this, the etching rate of the porous semiconductor layer at the time of etching can be made larger compared to the non-porous semiconductor layer 33, and the porous semiconductor layer 32 under the non-porous semiconductor layer 33 can be removed while leaving the non-porous semiconductor layer 33. For this reason, a dielectric can be disposed under the non-porous semiconductor layer 33 without using a SOI substrate, and the cost of SOI transistors can be lowered.

Figure 10:
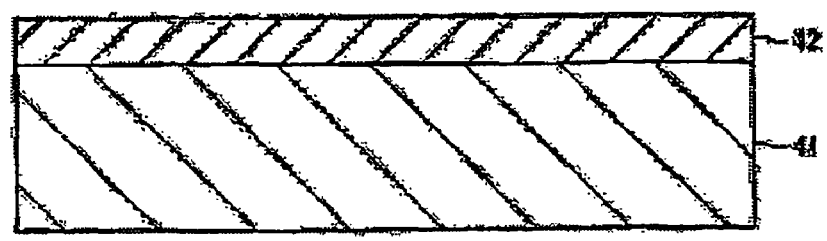
FIGS. 10(a)-10(c) are views showing a method for manufacturing a semiconductor device in accordance with a third embodiment of the present invention.
Figure 10:
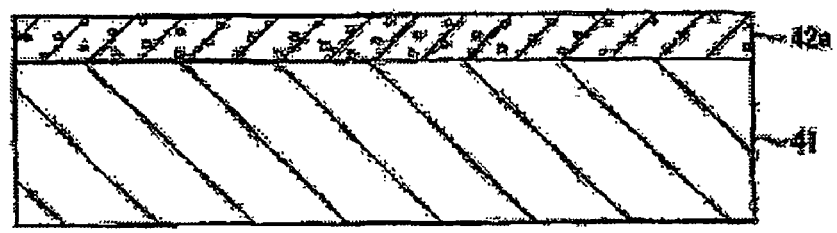
Figure 10:
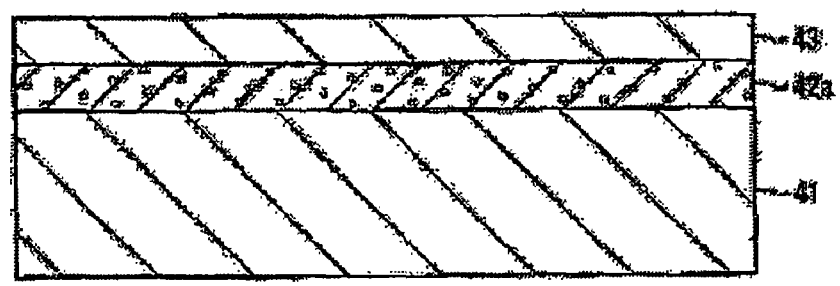

FIGS. 10(*a*)-10(*c*) are cross-sectional views showing a method for manufacturing a semiconductor device in accordance with a third embodiment of the present invention. Referring to FIG. 10(*a*), a first semiconductor layer 42 is formed on a semiconductor substrate 41 by epitaxial growth. Then, as shown in FIG. 10(*b*), a chemical conversion treatment is applied to the first semiconductor layer 42 to make the first semiconductor layer 42 to be porous, thereby forming a porous first semiconductor layer 42a on the semiconductor substrate 41.

Next, as shown in FIG. 10(c), a non-porous second semiconductor layer 43 is formed on the porous first semiconductor layer 42a by epitaxial growth. It is noted that, as materials for the semiconductor substrate 41, the porous first semiconductor layer 42a and the non-porous second semiconductor layer 43, for example, Si, Ge, SiGe, SiC, SiSn, PbS, GaAs, InP, GaP, GaN, ZnSe or the like can be used. In particular, when the semiconductor substrate 41 consists of Si, SiGe may preferably be used as the porous first semiconductor layer 42a, and Si as the non-porous second semiconductor layer 43. Then, processings similar to the processings shown in FIGS. 1 through 8 are conducted.

By this, the etching rate of the first semiconductor layer 42 can be increased, and the etching rate of the porous first semiconductor layer 42a with respect to the non-porous second semiconductor layer 43 can be increased without changing the materials of the first semiconductor layer 42 and the non-porous second semiconductor layer 43. For this reason, the porous first semiconductor layer 42a under the non-porous second semiconductor layer 43 can be removed while controlling the amount of etching of the non-porous second semiconductor layer 43, and the area of the SOI layer can be expanded. As a result, the gate width of SOI transistors can be broadened, and the current drivability of the SOI transistors can be improved.

Also, uniformity of the film thickness of the non-porous second semiconductor layer 43 formed on the dielectric film can be improved, and the film thickness of the dielectric film under the non-porous second semiconductor layer 43 can be increased. For this reason, fully depleted type SOI transistors can be stably formed without using a SOI substrate, and the cost of the fully depleted type SOI transistors can be reduced.

Figure 11:
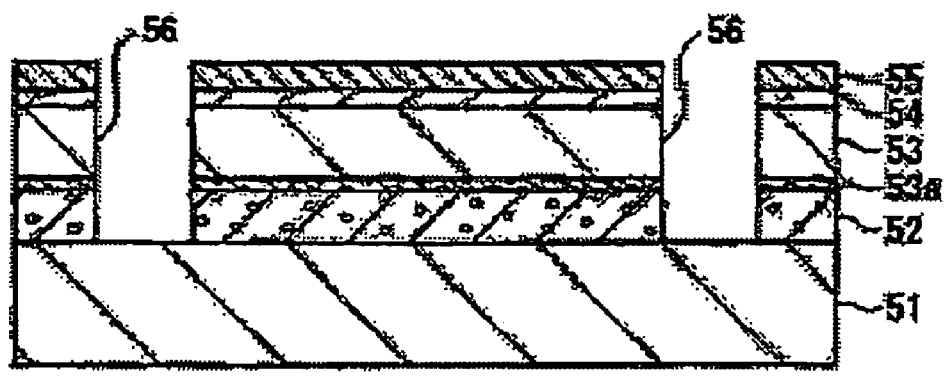
FIG. 11 is a view showing a method for manufacturing a semiconductor device in accordance with a fourth embodiment of the present invention.

FIG. 11 is a cross-sectional view showing a method for manufacturing a semiconductor device in accordance with a fourth embodiment of the present invention.

Referring to FIG. 11, a laminated structure in which a porous second semiconductor layer 53a is stacked on a porous first semiconductor layer 52 is formed on a semiconductor substrate 51. As a method for making the semiconductor porous, for example, a chemical conversion treatment can be used. Then, a non-porous second semiconductor layer 53 is formed on the porous second semiconductor layer 53a by epitaxial growth. Then, the non-porous second semiconductor layer 53 is thermally oxidized to form a sacrificial oxide film 54 on the surface of the non-porous second semiconductor layer 53. Then, an oxidation preventing film 55 is formed over the entire surface of the sacrificial oxide film 54 by a CVD method or the like. Then, grooves 56 that expose part of the semiconductor substrate 51 are formed in a manner similar to the step conducted in FIG. 2.

It is noted that, when a semiconductor layer formed on the semiconductor substrate 51 is to be made porous, only the porous second semiconductor layer 53a may be made porous. Alternatively, the porous second semiconductor layer 53a and only the surface layer of the porous first semiconductor layer 52 may be made porous. Alternatively, in addition to the porous first semiconductor layer 52 and the porous second semiconductor layer 53a, the surface layer of the semiconductor substrate 51 may also be made porous.

Figure 12:
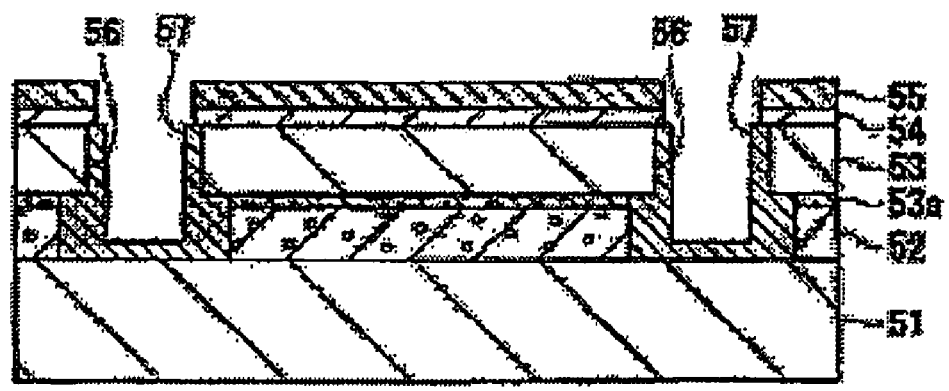
FIG. 12 is a view showing the method for manufacturing a semiconductor device in accordance with the fourth embodiment of the present invention.

Next, as shown in FIG. 12, side walls of the porous first semiconductor layer 52 and the porous second semiconductor layer 53a are thermally oxidized through the grooves 56, thereby forming supporting layers 57 for supporting the non-porous second semiconductor layer 53 under the non-porous second semiconductor layer 53. It is noted here that oxidation of a porous layer more quickly advances compared to a non-porous layer, and therefore the film thickness of an oxide film formed on the porous first semiconductor layer 52 and the porous second semiconductor layer 53a can be made larger than the film thickness of an oxide film formed on the non-porous second semiconductor layer 53. Then, processes similar to the processes shown in FIGS. 4 to 8 are conducted.

By this, the thickness of the supporting layers 57 that support the non-porous second semiconductor layer 53 can be made greater without expanding the width of the grooves 56 that are formed in the non-porous second semiconductor layer 53. For this reason, even when the porous first semiconductor layer 52 under the non-porous second semiconductor layer 53 is removed, the non-porous second semiconductor layer 53 can be stably supported, such that the porous first semiconductor layer 52 under the non-porous second semiconductor layer 53 can be removed in a wider range, and the area of the SOI layer can be expanded.

Also, by forming the porous second semiconductor layer 53a on the porous first semiconductor layer 52, the progress of thermal oxidation of the porous first semiconductor layer 52 and the progress of thermal oxidation of the porous second semiconductor layer 53a can be made equal to each other. For this reason, even when the porous first semiconductor layer 52 is formed from porous single-crystal SiGe, porous single-crystal Si can be disposed under the non-porous second semiconductor layer 53, and the oxide film formed by thermal oxidation of the porous single-crystal Si can block diffusion of Ge contained in the porous single-crystal SiGe into the non-porous second semiconductor layer 53. For this reason, even when the non-porous second semiconductor layer 53 and the porous first semiconductor layer 52 are formed from different materials, the supporting layers 57 can be formed by thermal oxidation of the porous first semiconductor layer 52 while controlling deterioration of the film quality of the non-porous second semiconductor layer 53.

Although the invention has been shown and described with respect to exemplary embodiments thereof, various other changes, additions and omissions in the form and detail thereof may be made therein without departing from the spirit and scope of the invention.

What is claimed is:

1. A method for manufacturing a semiconductor substrate comprising:
   forming a first semiconductor layer that has a first etching rate on a semiconductor substrate;
   forming a second semiconductor layer having a second etching rate smaller than the first etching rate of the first semiconductor layer;
   forming a first groove that penetrates the first semiconductor layer and the second semiconductor layer, such that at least a part of the semiconductor substrate is exposed in the first groove;
   forming a semiconductor supporting portion formed on side walls of the first groove, the semiconductor supporting portion having a third etching rate smaller than the first etching rate of the first semiconductor layer;
   forming a second groove in which at least a part of the first semiconductor layer is exposed such that at least a part of the semiconductor supporting portion remains;
   removing the first semiconductor layer by etching the first semiconductor layer through the second groove; and forming a first dielectric film and a second dielectric film by thermally oxidizing the semiconductor substrate, the second semiconductor layer and the semiconductor supporting portion, the forming of the first dielectric film and the second dielectric film being carried out such that the first dielectric film is disposed between a back surface side of the second semiconductor layer and the semiconductor substrate while the second dielectric film formed on side walls of the first groove and the second groove.

2. A method for manufacturing a semiconductor substrate according to claim 1, the semiconductor substrate and the second semiconductor layer including single-crystal Si, the semiconductor supporting portion including single-crystal Si or an oxide dielectric film, and the first semiconductor layer including single-crystal SiGe.

3. A method for manufacturing a semiconductor substrate according to claim 2, the first semiconductor layer being etched by a fluorine nitrate treatment.

4. A method for manufacturing a semiconductor substrate according to claim 1, further comprising embedding a dielectric into the first groove having the semiconductor supporting portion before forming the second groove.

5. A method for manufacturing a semiconductor substrate according to claim 1, further comprising embedding a dielectric into the first groove and the second groove after forming the first dielectric film on the back surface side of the second semiconductor layer.

6. A method for manufacturing a semiconductor substrate according to claim 1, further comprising embedding a dielectric into at least a part of an area of the back surface side of the second semiconductor layer, after forming the first dielectric film on the back surface side of the second semiconductor layer.

7. A method for manufacturing a semiconductor substrate according to claim 1, further comprising:

forming an oxidation preventing film on the second semiconductor layer;

forming the first groove to penetrate through the first semiconductor layer, the second semiconductor layer, and the oxidation preventing film;

removing the oxidation preventing film from the second semiconductor layer with the first dielectric film formed on the back surface side of the second semiconductor layer.

8. A method for manufacturing a semiconductor substrate according to claim 1, further comprising making the first semiconductor layer porous.

9. A method for manufacturing a semiconductor substrate according to claim 1, further comprising thermally oxidizing a part of the second semiconductor layer through the first groove.

10. A method for manufacturing a semiconductor substrate, comprising:

forming a porous semiconductor layer on a semiconductor substrate;

forming a non-porous semiconductor layer on the porous semiconductor layer;

forming a first groove that penetrates the porous semiconductor layer and the non-porous semiconductor layer, and exposes the semiconductor substrate;

forming a supporting portion on a side wall of the porous semiconductor layer and the non-porous semiconductor layer by thermally oxidizing the side wall of the porous semiconductor layer through the first groove;

forming a second groove that exposes at least a part of the porous semiconductor layer having the supporting portion formed on the side wall through the non-porous semiconductor layer;

removing the porous semiconductor layer by selectively etching the porous semiconductor layer through the second groove; and forming a dielectric film disposed on a back surface side of the non-porous semiconductor layer by thermally oxidizing the semiconductor substrate and the non-porous semiconductor layer through the second groove.

11. A method for manufacturing a semiconductor substrate according to claim 10, the semiconductor substrate, the porous semiconductor layer, and the non-porous semiconductor layer including single-crystal Si.

12. A method for manufacturing a semiconductor substrate according to claim 10, the semiconductor substrate including single-crystal Si, and the porous semiconductor layer including SiGe, and the non-porous semiconductor layer including single-crystal Si.

13. A method for manufacturing a semiconductor substrate according to claim 10, the porous semiconductor layer having a laminated structure composed of porous semiconductor layers consisting of different materials.

14. A method for manufacturing a semiconductor substrate according to claim 13, the porous semiconductor layer including single-crystal Si laminated on the single-crystal SiGe.

15. A method for manufacturing a semiconductor device, comprising:

forming a first semiconductor layer that has a fourth etching rate on a semiconductor substrate;

forming a second semiconductor layer having a fifth-etching rate smaller than a fourth-etching rate of the first semiconductor layer; the first semiconductor layer;

forming a first groove that penetrates the first semiconductor layer and the second semiconductor layer, such that at least a part of the semiconductor substrate is exposed in the first groove;

forming a semiconductor supporting portion formed on side walls of the first semiconductor layer and the second semiconductor layer in the first groove, and the second semiconductor layer having the fifth etching rate smaller than the fourth etching rate of the first semiconductor layer;

forming a second groove in which at least a part of the first semiconductor layer is exposed such that at least a part of the semiconductor supporting portion remains;

removing the first semiconductor layer by etching the first semiconductor layer through the second groove;

forming a first dielectric film and a second dielectric film by thermally oxidizing the semiconductor substrate, the second semiconductor layer and the semiconductor supporting portion, the forming of the first dielectric film and the second dielectric film being carried out such that the first dielectric film is disposed between a back surface side of the second semiconductor layer and the semiconductor substrate while the second dielectric film formed on side walls of the first groove and the second groove;

forming a gate electrode through a gate dielectric film over the second semiconductor layer; and forming source/drain portions disposed on both sides of the gate electrode in the second semiconductor layer.

16. A method for manufacturing a semiconductor device according to claim 15 further comprising:

forming an oxidation preventing film on the second semiconductor layer;

forming the first groove to penetrate through the first semiconductor layer, the second semiconductor layer, and the oxidation preventing film;

removing the oxidation preventing film from the second semiconductor layer with the first dielectric film formed on the back surface side of the second semiconductor.

17. A method for manufacturing a semiconductor device according to claim 15, further comprising making the first semiconductor layer porous.

18. A method for manufacturing a semiconductor device according to claim 15, the first groove and the second groove are disposed in element isolation regions.

19. A method for manufacturing a semiconductor device, comprising:

forming a porous semiconductor layer on a semiconductor substrate;

forming a non-porous semiconductor layer on the porous semiconductor layer;

forming a first groove that penetrates the porous semiconductor layer and the non-porous semiconductor layer, and exposes the semiconductor substrate;

forming a supporting portion a side wall of the porous semiconductor layer and the non-porous semiconductor layer by thermally oxidizing the side wall of the porous semiconductor layer through the first groove;

forming a second groove that exposes at least a part of the porous semiconductor layer having the supporting portion formed on the side wall through the non-porous semiconductor layer;

removing the porous semiconductor layer by selectively etching the porous semiconductor layer through the second groove;

forming a dielectric film disposed on a back surface side of the non-porous semiconductor layer by thermally oxidizing the semiconductor substrate and the non-porous semiconductor layer through the second groove;

forming a gate electrode through a gate dielectric film over the non-porous semiconductor layer; and forming source/drain portions disposed on both sides of the gate electrode in the non-porous semiconductor layer.

* * * * *